(12) United States Patent
Baek et al.

(10) Patent No.: US 6,756,668 B2
(45) Date of Patent: Jun. 29, 2004

(54) SEMICONDUCTOR PACKAGE HAVING THERMAL INTERFACE MATERIAL (TIM)

(75) Inventors: Joong-Hyun Baek, Kyungki-do (KR); Ho-Jeong Moon, Chungcheongnam-do (KR); Dong-Kil Shin, Daejeon (KR); Yun-Hyeok Im, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/232,344

(22) Filed: Aug. 30, 2002

(65) Prior Publication Data

US 2003/0080411 A1 May 1, 2003

(30) Foreign Application Priority Data

Oct. 25, 2001 (KR) .......................................... 2001-65962

(51) Int. Cl.[7] .............................................. H01L 23/12
(52) U.S. Cl. ........................ 257/704; 257/705; 257/706; 257/707; 257/719; 257/720
(58) Field of Search ................................ 257/704–707, 257/719–720

(56) References Cited

U.S. PATENT DOCUMENTS 5,298,791 A    3/1994  Liberty et al.
5,658,831 A  *  8/1997  Layton et al. ................ 29/832

FOREIGN PATENT DOCUMENTS

JP          03-068157          3/1991

OTHER PUBLICATIONS

English Language of Abstract for Japanese Patent Publication No. JP03–068157, published Mar. 25, 1991.

* cited by examiner

Primary Examiner—Luan Thai
(74) Attorney, Agent, or Firm—Marger Johnson & McCollom, P.C.

(57) ABSTRACT

A semiconductor package and a method for forming the same are provided. The semiconductor package comprises a chip having an active surface and a back surface. The semiconductor package further comprises a substrate having an upper surface and a lower surface opposite the upper surface. The chip is electrically connected to the upper surface of the substrate. A lid is thermally coupled to the back surface of the chip. A thermal interface material (TIM) is located between the chip and the lid. The TIM includes voids to reduce thermomechanical stresses applied on the chip and the TIM, thereby preventing package cracks.

15 Claims, 5 Drawing Sheets

US 6,756,668 B2

SEMICONDUCTOR PACKAGE HAVING THERMAL INTERFACE MATERIAL (TIM)

RELATED APPLICATION

This application claims priority from Korean Patent Application No. 2001-65962, filed on Oct. 25, 2001, the contents of which are incorporated herein by reference in their entirety.

BACKGROUND OF THE INVENTION

1. Field of the Invention

The present invention relates generally to the field of semiconductor devices and, more particularly, to a semiconductor chip package having a thermal interface material (TIM).

2. Description of the Related Art

Wire bonding is typically used to make electrical connections between a central processing unit (CPU) and chip Input/Outputs (I/Os) (e.g., the inner leads of semiconductor packages). Flip-chip technologies have been employed to package high-speed semiconductor devices. There are two types of semiconductor package structures formed using the flip-chip technologies; a lid type and a non-lid type. The lid type structure is typically used in chip packages that include a high-frequency CPU chip that generates large quantity of heat. The non-lid type structure is generally used in chip packages that have a low-frequency CPU chip that generates a relatively small quantity of heat.

FIGS. 1 and 2 show a conventional semiconductor chip package 100 having a lid 40. Electrode bumps 24 of a CPU chip 20 are attached to the upper surface 12 of a substrate 10 using flip-chip technology. The CPU chip 20 is covered with a lid 40. A plurality of external connection pins 30, electrically connected to the CPU chip 20, extend from a lower surface of the substrate 10. An epoxy resin 52 is formed between the CPU chip 20 and the substrate 10 as an underfill adhesive.

The lid 40 is made of a material having a good heat emissive capacity. In order to maximize the heat emissive capacity through the lid 40, a thermal interface material (TIM) 60 is interposed between a bottom surface 42 of the lid 40 and a back surface of the CPU chip 20. A non-conductive adhesive 54 (e.g., a non-conductive thermosetting silicone adhesive) is used as a sealant for attaching the lid 40 to the upper surface 12 of the substrate 10. After applying the non-conductive adhesive 54 to the perimeter of the substrate 10, the lid 40 is attached, and the non-conductive adhesive 54 is cured (hardened). Thus, the space on which the CPU chip 20 is mounted is encapsulated.

The TIM 60 can be a thermal grease type material or a rigid type material (such as epoxy or solder). The thermal grease type has a thermal conductivity of 1 to 6 W/mk. Epoxy has a thermal conductivity of 10 to 25 W/mk. Solder has a thermal conductivity of 25 to 80 W/mk.

In a conventional semiconductor package 100, the TIM 60 is arranged between the lid 40 and the CPU chip 20. In this arrangement, damage may occur depending on the type of TIM 60 used. For example, thermomechanical stresses arise due to differences in the coefficients of thermal expansion (CTE) between the lid 40, the CPU chip 20 and TIM 60. These CTE differences are commonly referred to as a "CTE mismatch." Although the thermal grease type TIM does a good job of absorbing thermomechanical stresses between the lid 40 and the CPU chip 20, it has a poor heat emissive capacity. The rigid type TIM, such as solder, however, has a good heat emissive capacity, but is not capable of sufficiently absorbing the thermomechanical stresses between the lid 40 and the CPU chip 20. As a result, cracks occur in the rigid type TIM 60 itself or in the CPU chip 20.

Accordingly, there is a need for a semiconductor package that uses a solder or other material having a good heat emissive capacity as a thermal interface material and has an improved structure for absorbing thermomechanical stress.

SUMMARY OF THE INVENTION

The present invention provides a semiconductor package having voids formed in the thermal interface material (TIM), e.g., solder. The voids reduce the thermomechanical stresses to prevent the cracks of chip as well as those of the TIM.

The semiconductor package comprises a chip having an active surface and a back surface. The semiconductor package further comprises a substrate having an upper surface and a lower surface opposite the upper surface. The chip is electrically connected to the upper surface of the substrate. A lid is thermally coupled to the back surface of the chip. A TIM is located between the chip and the lid. The TIM includes voids to reduce thermomechanical stresses applied on the chip and the TIM, thereby preventing package cracks.

According to one embodiment of the present invention, a plurality of void pads, formed of a material non-wettable by the TIM, e.g., solder, are arranged on the back surface of the chip. A copper pattern layer is formed on the back surface of the chip. The void pads are left exposed on the back surface of the chip. A nickel/gold plating layer is formed on the copper pattern layer. The voids are aligned with the plurality of void pads.

According to one aspect of the present invention, a solvent contained in a flux is volatilized to generate a gas during the reflow of the solder located between the lid and the chip. The gas concentrates on the void pads, thus forming voids having a predetermined size.

BRIEF DESCRIPTION OF THE DRAWINGS

These and other objects, features and advantages of the present invention will be more readily understood through the following detailed description of preferred embodiments thereof, provided in conjunction with the accompanying drawings, wherein like reference numerals designate like structural elements, and, in which.

DETAILED DESCRIPTION OF PREFERRED EMBODIMENTS

Figure 1:
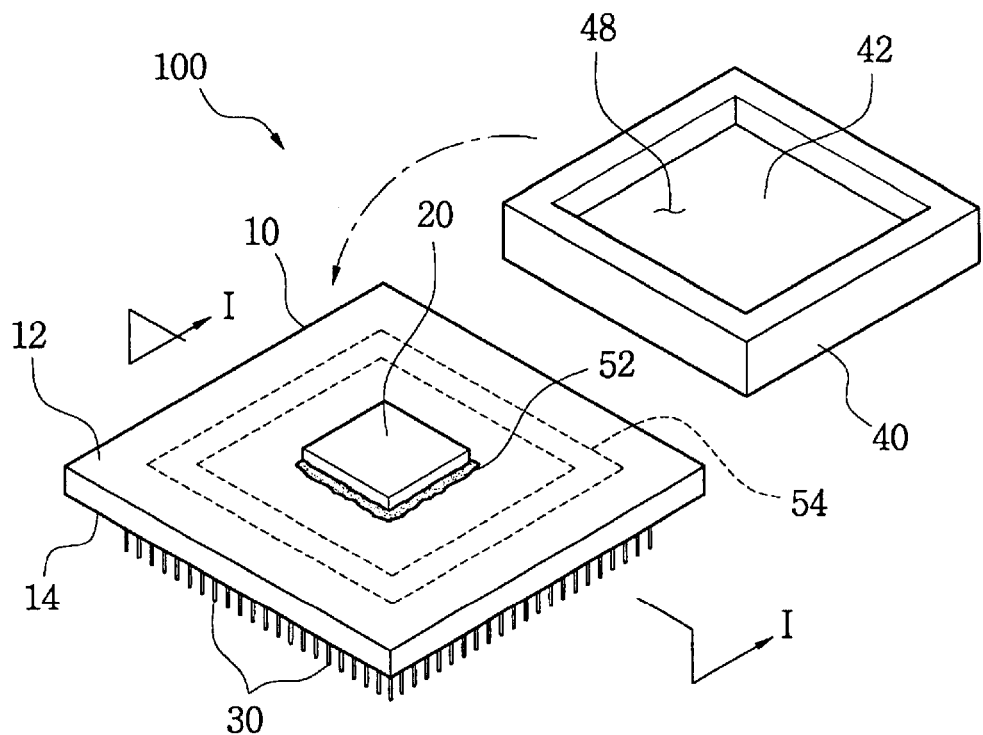
FIG. 1 is a perspective view of a conventional semiconductor package having a lid.
Figure 2:
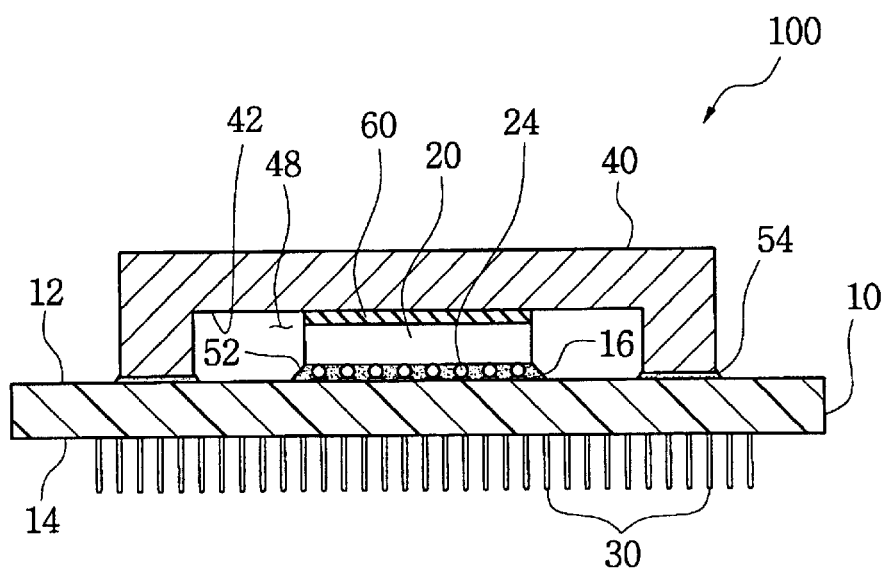
FIG. 2 is a cross-sectional view of the conventional semiconductor package of FIG. 1, taken along line I—I.
Figure 3:
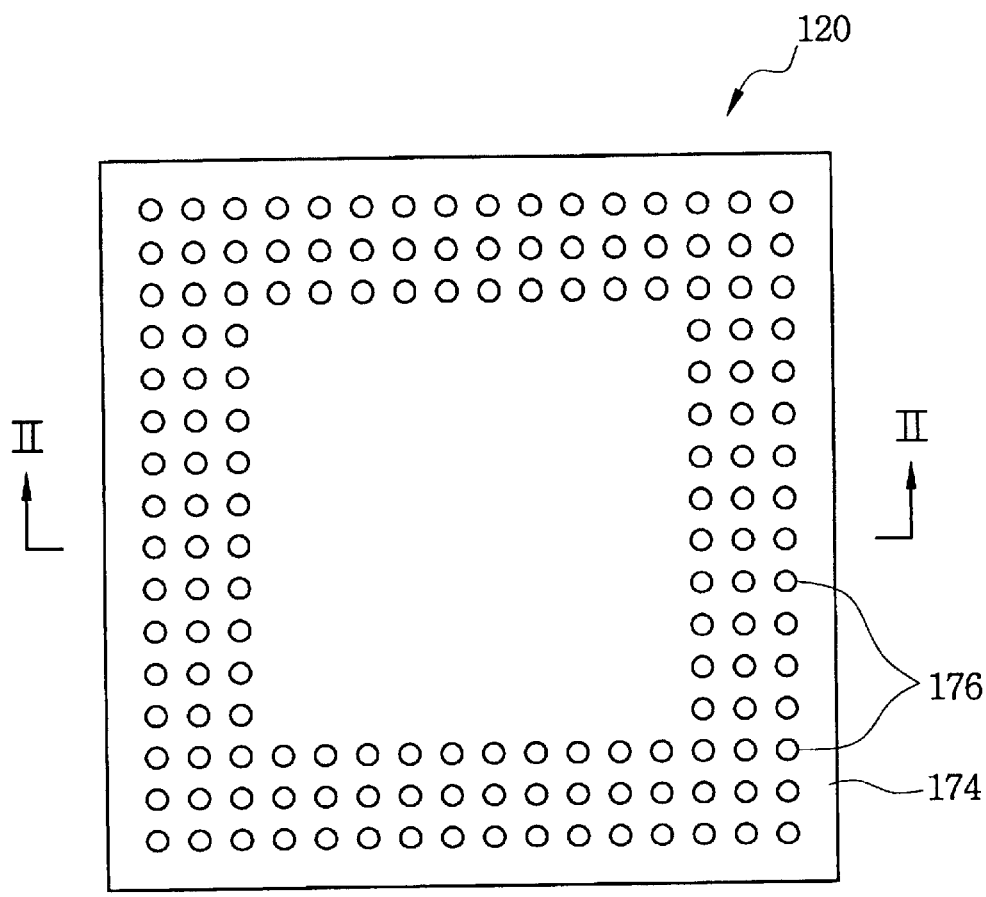
FIG. 3 is a plan view of a CPU chip of a semiconductor package constructed according to a first embodiment of the present invention, wherein a copper pattern layer is formed on a back surface of the CPU chip.
Figure 4:
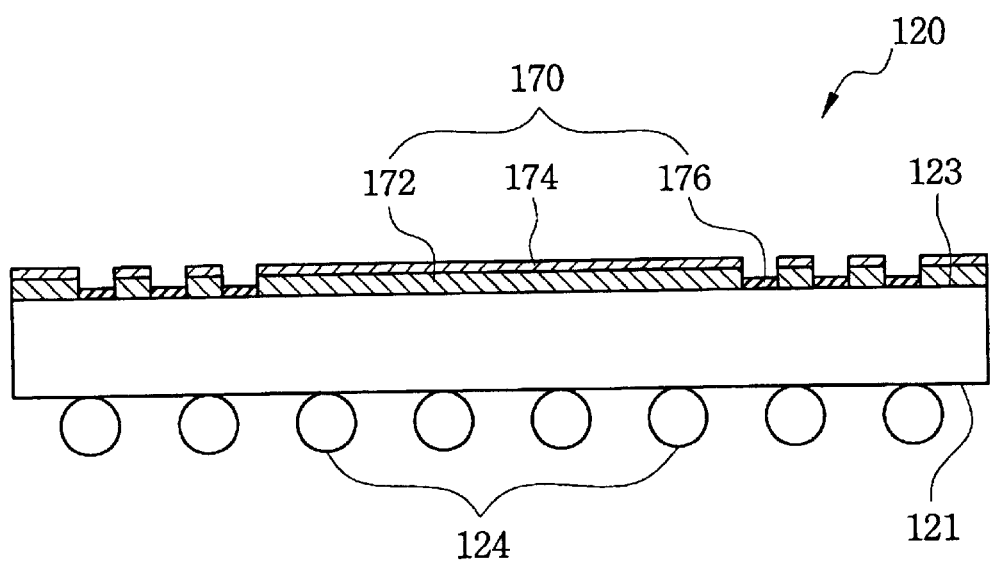
FIG. 4 is a cross-sectional view of the CPU chip in FIG. 3, taken along line II—II.
Figure 5:
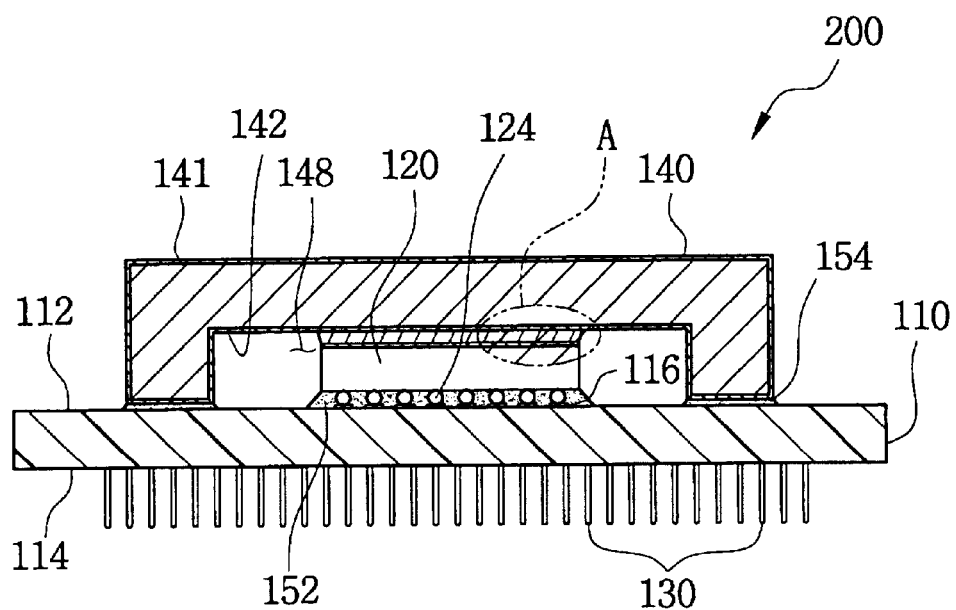
FIG. 5 is a cross-sectional view of a semiconductor package constructed according to an embodiment of this invention, wherein a lid is attached to a back surface of a CPU chip using a solder as a thermal interface material.
Figure 6:
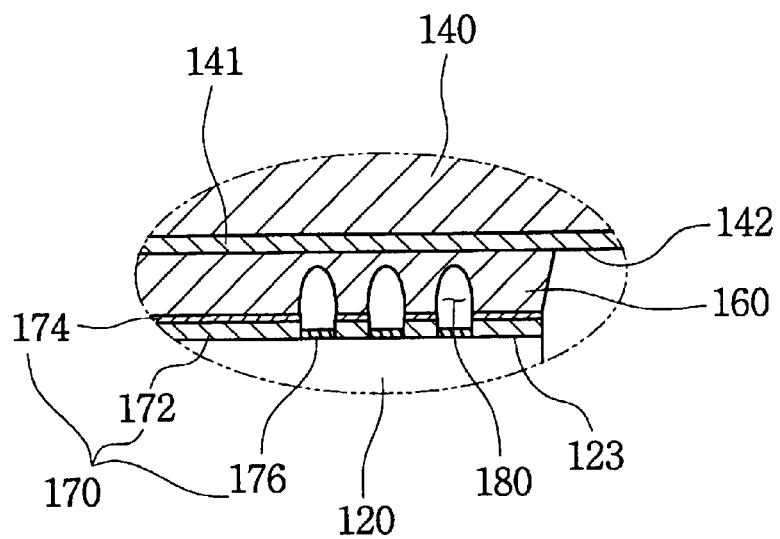
FIG. 6 is an enlarged cross-sectional view of section A of the semiconductor package shown in FIG. 5.
Figure 7:
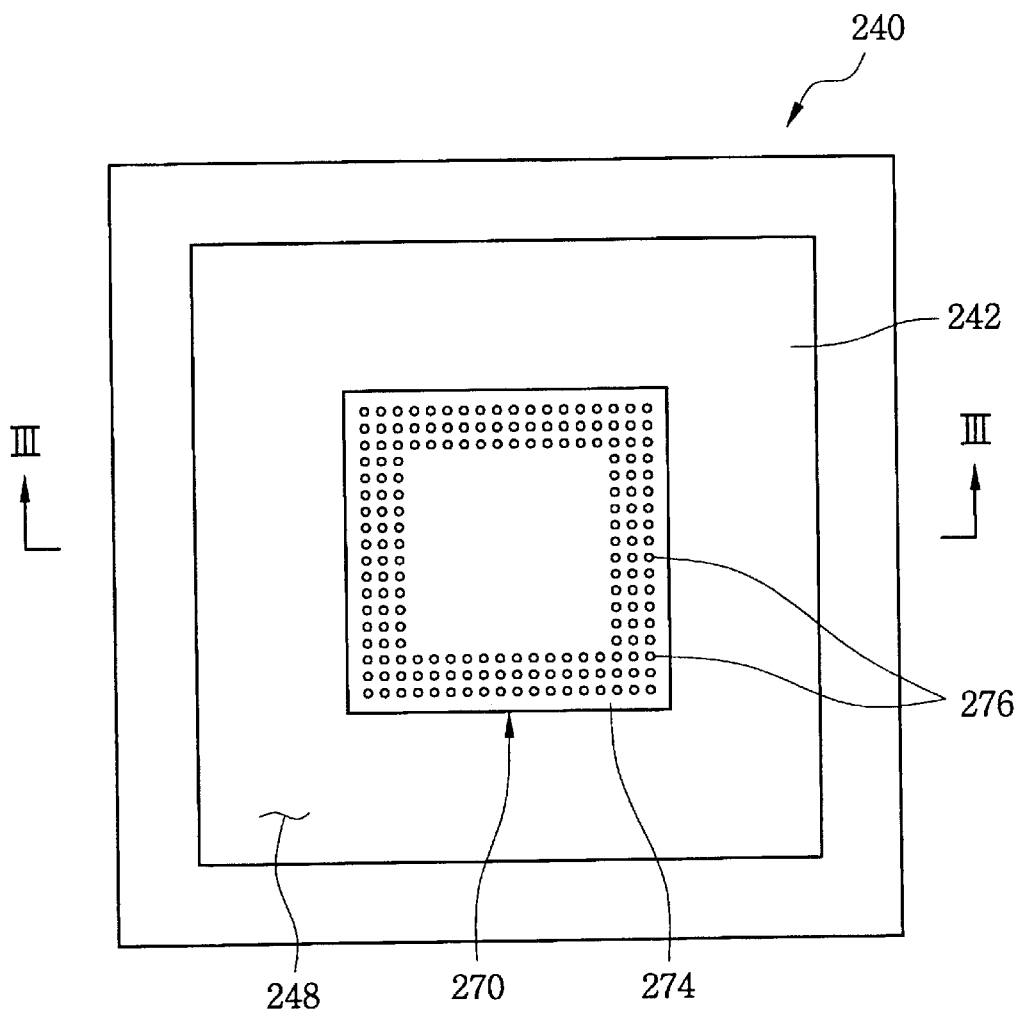
FIG. 7 is a cross-sectional view of a lid of a semiconductor package constructed according to yet another embodiment of the present invention, wherein a copper patter layer is formed on a bottom surface of the lid.
Figure 8:
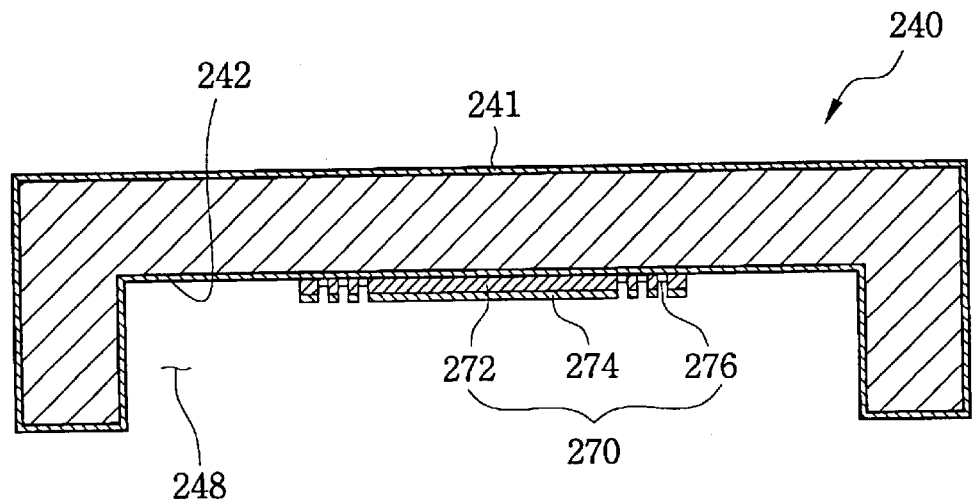
FIG. 8 is a cross-sectional view of the lid in FIG. 7 taken along line III—III.

Preferred embodiments of the present invention will be described below with reference to the accompanying drawings. FIG. 3 is a plan view of a CPU chip 120 of a semiconductor package constructed according to one embodiment of the present invention. FIG. 4 is a cross-sectional view of the CPU chip 120 taken along line II—II in FIG. 3. A copper pattern layer 172 is formed on a back surface of the CPU chip 120. FIG. 5 is a cross-sectional view of a semiconductor package 200, in which a lid 140 is attached to the back surface of the CPU chip 120, using solder as a thermal interface material. FIG. 6 is an enlarged cross-sectional view of section A of the semiconductor package 200, shown in FIG. 5.

Referring to FIGS. 3 through 6, the CPU chip 120 is attached to an upper surface 112 of a substrate 110 through electrode bumps 124 using flip chip technologies. The CPU chip 120 is covered with a lid 140. The substrate 110 is typically a ceramic substrate providing a circuit wiring board having wiring patterns. The substrate 110 can, however, be a printed circuit substrate, a tape wiring substrate, or other substrate. A thermal interface material 160 (such as solder), having a good heat emissive capacity, is interposed between the lid 140 and the CPU chip 120. A plurality of external connection pins 130 are electrically connected to the CPU chip 120 and extend outwardly away from a lower surface 114 of the substrate 110. An epoxy resin 152 fills an area between the CPU chip 120 and the substrate 110 to provide an underfill adhesive. According to this embodiment, voids 180 are formed in the thermal interface material 160 to absorb thermomechanical stresses. The voids 180 are preferably formed at uniform distances from each other along the perimeter of the CPU chip 120, where the thermomechanical stresses are concentrated.

Referring to FIGS. 3 and 4, in order to form the voids 180, a patterned layer 170 is formed between a back surface of the CPU chip 120 and the thermal interface material 160. The patterned layer 170 comprises void pads 176, a copper pattern layer 172, and a nickel/gold plating layer 174. The void pads 176 are preferably made of a material (such as a photo solder resist (PSR) film and a polyimide tape) that is non-wettable by solder. The void pads 176 can be arranged substantially uniformly along the perimeter of the back surface 123 of the CPU chip 120. The copper pattern layer 172 covers the back surface 123 of the CPU chip 120 except for areas in which the void pads 176 are formed. The nickel/gold plating layer 174 is formed on the copper pattern layer 172 and prevents oxidation of the copper pattern layer 172. The nickel/gold plating layer 174 also ensures a good bondability between the copper pattern layer 172 and the thermal interface material 160.

The formation of the voids 180 will now be described with reference to FIGS. 3 through 6. Electrode bumps 124 are arranged on an active surface 121 of the CPU chip 120. The CPU chip 120 is flip-chip bonded to the substrate 110.

The CPU chip 120, having the patterned layer 170, is mounted on substrate pads 116 of an upper surface 112 of the substrate 110 through the electrode bumps 124. A reflow process is performed at a temperature of about 350 to 360° C. for approximately 100 seconds. A space between the CPU chip 120 and the substrate 110 is then filled with a liquid epoxy resin 152 at a predetermined temperature to provide an underfill adhesive.

The substrate pads 116, connected to the electrode bumps 124 of the CPU chip 120, are arranged on the upper surface 112 of the substrate 110. The substrate 110 includes wiring patterns (not shown) that electrically connect the substrate pads 116 to external connection pins 130. The external connection pins 130 are arranged on a lower surface 114 of the substrate 110. Other types of connections means such as ball type external connections may be used instead of the pins 130.

The lid 140 is preferably formed using a conductive metal as a base material and using a separate conductive material (such as Ni, Au, Ag, Sn, or Cr) to coat the surface thereof. The conductive metal base material can, for example, be Cu, Al, CuW, AlSiC, AlN, BeO, or other material that provides good heat emissive capacity. The lid 140 includes a cavity 148 in which the CPU chip 120 is mounted. The cavity 148 is surrounded by an outer wall, which is attached to the upper surface 112 of the substrate 110. The lid 140 can, for instance, be formed using AlSiC as a base material with a nickel plating layer 141 formed on the surface thereof. The lid 140 also preferably includes a gold plating layer arranged on a bottom surface 142 thereof to face the back surface 123 of the CPU chip 120. The gold plating layer of the lid 140 and the gold plating layer of the nickel/gold plating layer 174 of the chip 120 are absorbed into the solder during a solder reflow process. These gold plating layers are therefore not shown in the drawings.

In order to maximize heat emissive capacity through the lid 140, the thermal interface material 160 (e.g., solder) is preferably located between the bottom surface 142 of the lid 140 and the back surface 123 of the CPU chip 120. The solder is preferably bonded to the back surface 123 of the CPU chip 120 and the bottom surface 142 of the lid 140 through a solder reflow process. The solder reflow process is preferably performed by applying a flux containing a solvent to the back surface 123 of the CPU chip 120, forming a solder preform on the flux, putting the lid 140 on the solder preform, and reflowing the solder preform. The solvent contained in the flux is volatilized to generate a gas.

Also during the solder reflow process, the voids 180 are formed above the void pads 176. The void pads 176 are formed of a material that is non-wettable by solder. The solvent gas around the void pads 176 is absorbed into the space over the void pads 176, thereby forming the voids 180. The voids 180 are preferably substantially uniform in size.

The lid 140 is preferably attached to the upper surface 112 of the substrate 110 using a non-conductive adhesive 154 (such as a non-conductive thermosetting silicone adhesive) as a sealant. More particularly, the non-conductive adhesive 154 is applied to the area of the substrate 110 to which the lid 140 is to be attached. After the lid 140 is properly positioned, the adhesive is cured (hardened) to hermetically seal the CPU chip mounted area. The curing process for the non-conductive adhesive 154 is preferably carried out at a temperature of approximately between 100 to 150° C. for about one hour. The CPU chip 120 is thereby encapsulated within the element mounting space (cavity) 148.

According to the principles of the present invention described above, solder can be used as the thermal interface material to provide good heat emissive characteristics. In addition, the voids 180 formed in the thermal interface material 160 along the perimeter of the CPU chip 120 relieve thermomechanical stresses that arise due to differences between the coefficients of thermal expansion of the CPU chip 120, the thermal interface material 160, and the lid 140. Defects such as cracks in the CPU chip 120 or thermal interface material 160 are thereby prevented.

Unfortunately, however, the voids 180 formed in the thermal interface material 160 may reduce the heat emissive capacity of the semiconductor package. In order to minimize degradation of the thermal characteristics while still relieving the thermomechanical stresses, the voids 180 of the present embodiment are arranged uniformly along the perimeter of the CPU chip 120. If power is consumed uniformly over substantially the entire area of the CPU chip 120, then the thermal stresses will be concentrated on the perimeter of the CPU chip 120 rather than on the center portion of the CPU chip 120. In other words, the temperature at the perimeter of the CPU chip 120 will be higher than that of the center portion of the CPU chip 120. This concentrates the thermomechanical stresses at the perimeter of the CPU chip 120.

In this embodiment, the voids 180 occupy approximately 20% of the area around the perimeter of the CPU chip 120 (which, in turn, occupies about 40% of the entire area of the CPU chip 120). Accordingly, in the preferred embodiment, the voids 180 occupy about 10% of the area of the back surface 123 of the CPU chip 120. The voids 180 could, however, be configured to occupy anywhere between about 5 to 50% of the area of the back surface 123 of the CPU chip 120.

The following table (Table 1) shows the results of a simulation comparing thermal characteristics of a semiconductor package 200 constructed according to the foregoing embodiment (having voids 180 formed along the perimeter of the CPU chip 120) with a conventional semiconductor package formed without voids. These simulation results show that thermal performance of the package 200 is not significantly affected by the presence of the voids 180. As shown in Table 1, the presence of the voids 180 results in only a 2.25% reduction in thermal performance. The comparison was made using ABAQUS software and assumed that the heat completely passes through the back surface 123 of the CPU chip 120, the thermal interface material 160, and the lid 140, and that motion power of 155 W is consumed uniformly over the entire area of the CPU chip 120. For this simulation, the lid 140 was presumed to be made of AlSiC having a thermal conductivity of 150 W/mk, and the thermal interface material 160 was presumed to be solder having a thermal conductivity of 20 W/mk.

TABLE 1

| Package Type | Semiconductor package without voids | Semiconductor package with voids |
| --- | --- | --- |
| Thermal resist (° C./Watt) | 0.0578 | 0.0592 |
| Thermal performance comparison | 0.0% (standard) | 2.25% reduction compared to standard |

Referring now to FIGS. 7 through 10, in an alternative embodiment, a patterned layer 270 may be formed on a bottom surface 242 of a lid 240, rather than on the back surface 123 of the CPU chip 120, as in the embodiment shown in FIGS. 3 through 6. More particularly, in this embodiment, the patterned layer 270 is formed on the bottom surface 242 of the lid 240. A nickel plating layer 241 is also arranged on the lid 240. The patterned layer 270 comprises void pads 276 uniformly arranged on the bottom surface 242 of the lid 240. The voids are arranged in an area that corresponds to a perimeter of a back surface 223 of the CPU chip 220. The patterned layer 270 further includes a copper pattern layer 272 that covers the bottom surface 242 of the lid 240 except for the void pads 276. A nickel/gold plating layer 274 is also part of the patterned layer 270 and is formed on the copper pattern layer 272. As in the previous embodiment, the void pads 276 are preferably formed of a material that is non-wettable by solder. The nickel/gold plating layer 274 prevents oxidation of the copper pattern layer 272 and induces good bondability between the copper pattern layer 272 and the solder.

Although the gold plating layer is formed on the back surface 223 of the CPU chip to enable the solder to be easily bonded to the back surface 223 of the CPU chip 220, the gold plating layer is not illustrated in the drawings because it is absorbed into the solder during a solder reflow process. The process for forming the voids 280 in this embodiment is similar to that described previously with respect to the earlier-described embodiment and a detailed description thereof will therefore be omitted herein.

Figure 9:
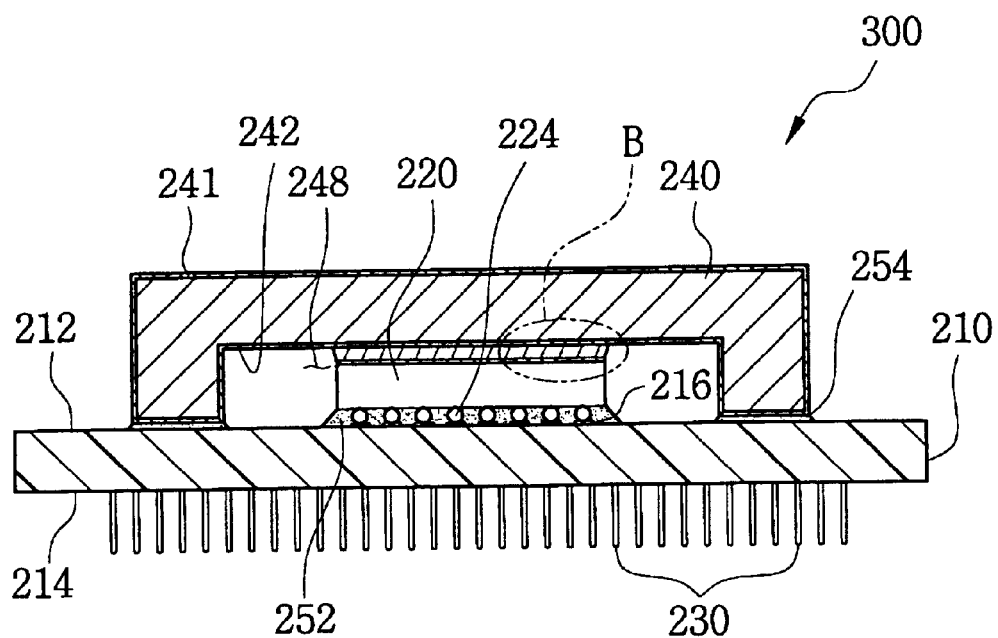
FIG. 9 is a cross-sectional view of a semiconductor package constructed according to a still further embodiment of this invention, wherein a lid is attached to a back surface of a CPU chip using a solder as a thermal interface material.
Figure 10:
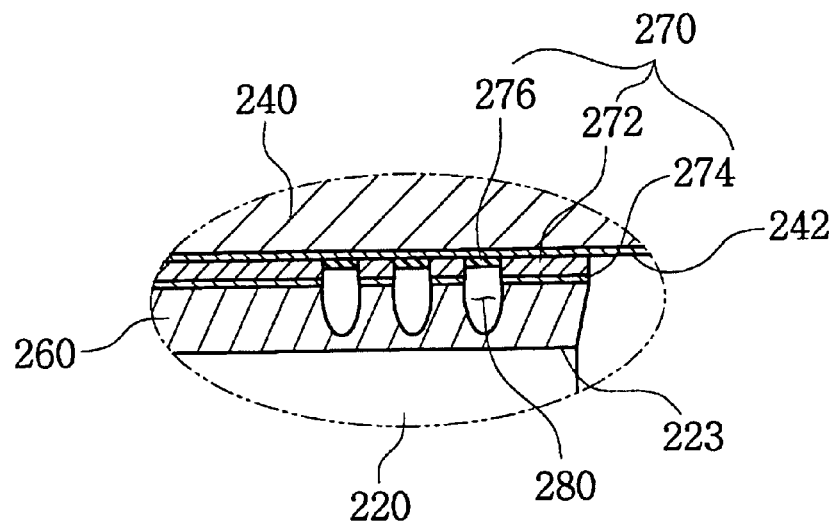
FIG. 10 is an enlarged cross-sectional view of section B of the package in FIG. 9.

Referring to FIGS. 9 and 10, a semiconductor package 300 incorporating the chip 220 and lid 240 of this embodiment is similar to the previously-describe package 200, except that the voids 280 are formed on the void pads 276 of the patterned layer 270 arranged on the lid 240. Because of the similarities between the two embodiments, the semiconductor package of this embodiment will not be further described in detail herein.

Although preferred embodiments of the present invention have been described in detail hereinabove, it should be understood that many variations and/or modifications of the basic inventive concepts herein taught will be apparent to those skilled in the art. All such variations and modifications, therefore, should be considered to fall within the spirit and scope of the present invention as defined in the appended claims.

Among these many possible variations, for example, the voids may be formed such that some are located in proximity to the CPU chip and others are located in proximity to the lid. This represents a hybrid approach of the previously described embodiments. In this hybrid approach, the voids formed near the CPU chip preferably do not overlap with the voids formed near the lid.

According to certain principles of the present invention, solder can be used as a thermal interface material between the CPU chip and the lid to effectively improve the heat emissive capacity of the semiconductor package. Furthermore, thermomechanical stresses caused by differences between coefficients of thermal expansion of the CPU chip, lid, and thermal interface material, can be absorbed by voids formed along the perimeter of the CPU chip in the thermal interface material, thereby preventing damage that might otherwise result from those stresses.

Although the above-described embodiments are described in connection with the CPU chip, a person skilled in the art will appreciate that the principles of the present invention can be applied in others types of semiconductor chips that generate a large quantity of heat.

Although a preferred embodiment of the present invention has been described in detail hereinabove, it should be understood that many variations and/or modifications of the basic inventive concepts herein taught will be apparent to those skilled in the art. Such modifications and variations fall within the spirit and scope of the present invention as defined in the appended claims.

What is claimed is:

1. A semiconductor package, comprising:
   a chip having an active surface and a back surface, the chip having a plurality of electrode bumps formed on the active surface;
   a substrate having an upper surface and a lower surface opposite the upper surface, the chip being flip-chip bonded to the upper surface of the substrate;
   external connection terminals extending from the lower surface of the substrate and electrically connected to the chip;
   a lid thermally coupled to the back surface of the chip for emitting heat generated from the chip; and
   a thermal interface material (TIM) located between the chip and the lid for transmitting heat generated from the chip to the lid, the TIM including voids arranged at uniform distances from each other.

2. The semiconductor package of any of claim 1, wherein the voids are formed along a perimeter of the chip.

3. The semiconductor package of claim 1, wherein the TIM is solder.

4. The semiconductor package of claim 1, further comprising:
   a plurality of void pads formed of a material non-wettable by the TIM and arranged on the back surface of the chip;
   a copper pattern layer formed on the back surface of the chip, wherein the void pads are left exposed on the back surface of the chip; and
   a nickel/gold plating layer formed on the copper pattern layer,
   wherein the voids are aligned with the plurality of void pads.

5. The semiconductor package of claim 4, wherein the void pads comprise a photo solder resist or a polyimide tape.

6. The semiconductor package of claim 1, further comprising:
   a plurality of void pads formed of a material non-wettable by the TIM and arranged on the bottom surface of the lid;
   a copper pattern layer formed on the bottom surface of the lid, wherein the void pads are left exposed on the back surface of the chip; and
   a nickel/gold plating layer formed on the copper pattern layer,
   wherein the voids are aligned with the plurality of void pads.

7. The semiconductor package of claim 6, wherein the void pads comprise a photo solder resist or a polyimide tape.

8. The semiconductor package of claim 1, further comprising:
   a first plurality of void pads formed of a material non-wettable by the TIM and arranged on the back surface of the chip;
   a second plurality of void pads formed of a material non-wettable by the TIM and arranged on the bottom surface of the lid;
   a copper pattern layer formed on the bottom surface of the lid and on the back surface of the chip, wherein the first and second plurality of void pads are exposed through the copper pattern layer; and
   a nickel/gold plating layer formed on the copper pattern layer, wherein the voids are aligned with the plurality of void pads.

9. The semiconductor package of claim 8, wherein the voids comprise first and second sets of voids, the first set of voids being arranged in proximity to the chip and the second set of voids being arranged in proximity to the lid.

10. The semiconductor package of claim 9, wherein the first and the second sets of voids do not overlap each other.

11. The semiconductor package of claim 8, wherein the voids are formed at uniform distances from each other along the perimeter of the back surface of the chip.

12. The semiconductor package of claim 1, wherein the voids occupy approximately between 5 and 50% on the back surface of the chip.

13. The semiconductor package of claim 12, wherein the voids occupy about 10% on the back surface of the chip.

14. The semiconductor package of claim 1, wherein the chip is a central processing unit (CPU) chip.

15. A semiconductor package, comprising:
   a chip having an active surface and a back surface;
   a substrate having an upper surface and a lower surface opposite the upper surface, the chip being electrically connected to the upper surface of the substrate;
   a lid thermally coupled to the back surface of the chip; and
   a TIM located between the chip and the lid, wherein the TIM includes voids,
   wherein the voids are formed alone a perimeter of the chip at substantially uniform distances from each other.

* * * * *